US006693501B2

(12) United States Patent
Sawada et al.

(10) Patent No.: US 6,693,501 B2
(45) Date of Patent: Feb. 17, 2004

(54) SURFACE ACOUSTIC WAVE APPARATUS USING FILTERS WITH OVERLAPPED PROPAGATION PATHS AND COMMUNICATIONS UNIT

(75) Inventors: Yoichi Sawada, Ishikawa-ken (JP); Hiroshi Takasaki, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 64 days.

(21) Appl. No.: 10/092,604

(22) Filed: Mar. 8, 2002

(65) Prior Publication Data

US 2002/0135442 A1 Sep. 26, 2002

(30) Foreign Application Priority Data

Mar. 23, 2001 (JP) ........................ 2001-086170

(51) Int. Cl.[7] .............. H03H 9/64; H03H 9/72; H03H 9/25
(52) U.S. Cl. .............. 333/193; 333/195; 333/133
(58) Field of Search ............... 333/193–196, 333/133

(56) References Cited

U.S. PATENT DOCUMENTS

| 5,994,980 | A | * | 11/1999 | Tada ........................ 333/193 |
| 6,424,239 | B1 | * | 7/2002 | Ehara et al. ................ 333/193 |
| 6,424,240 | B1 | * | 7/2002 | Yoshikawa .................. 333/195 |
| 6,483,402 | B2 | * | 11/2002 | Endoh et al. ............... 333/193 |
| 6,556,100 | B2 | * | 4/2003 | Takamine ................... 333/133 |

FOREIGN PATENT DOCUMENTS

| JP | 10-117123 | * | 5/1998 |
| JP | 10-341135 | * | 12/1998 |

* cited by examiner

Primary Examiner—Barbara Summons
(74) Attorney, Agent, or Firm—Keating & Bennett, LLP

(57) ABSTRACT

In a surface acoustic wave (SAW) apparatus, a first SAW filter device and a second SAW filter device are disposed on a piezoelectric substrate such that their respective propagation paths overlap. When the center-to-center distance between the first and second SAW filter devices are indicated by $d_1$, and when the thickness of the piezoelectric substrate is indicated by t, the first and second SAW filter devices and the piezoelectric substrate are arranged so as to satisfy the condition $d_1 \leq 2.3 \times t$ or $d_1 \geq 2.8 \times t$.

20 Claims, 9 Drawing Sheets

FIRST-STAGE FILTERING CHARACTERISTICS (BROKEN LINE INDICATES FILTERING CHARACTERISTICS UNAFFECTED BY BULK WAVES)

FIG.5B +

SECOND-STAGE FILTERING CHARACTERISTICS (BROKEN LINE INDICATES FILTERING CHARACTERISTICS UNAFFECTED BY BULK WAVE)

FIG.5C ↓

TWO-STAGE CASCADE-CONNECTED FILTERING CHARACTERISTICS

US 6,693,501 B2

SURFACE ACOUSTIC WAVE APPARATUS USING FILTERS WITH OVERLAPPED PROPAGATION PATHS AND COMMUNICATIONS UNIT

BACKGROUND OF THE INVENTION

1. Field of the Invention

The present invention relates to a surface acoustic wave (SAW) apparatus, such as a SAW filter, and more particularly, to a SAW apparatus having a balanced-to-unbalanced conversion function and having different impedance characteristics at an input side and an output side of the SAW apparatus. The present invention also relates to a communications unit including the above-described SAW apparatus.

2. Description of the Related Art

There has been significant technological progress in decreasing the size and weight of portable communications units, such as cellular telephones. One method to decrease the size and weight is to reduce the number and the size of the individual components of communications units. Additionally, components having composite functions are being developed.

In view of this background, as a SAW filter used in an RF stage, a balanced filter provided with a balanced-to-unbalanced conversion function (so-called "balun function") or a multi-band filter provided with a plurality of pass bands is used.

For example, Japanese Unexamined Patent Application Publication No. 10-117123 discloses a balanced SAW filter unit which utilizes an unbalanced input and a balanced output by combining SAW filters whose transmission phase characteristics are 180° out of phase with each other. The configuration of the SAW filter unit disclosed in the above publication is shown in FIG. 9.

The SAW filter unit shown in FIG. 9 includes longitudinally coupled SAW filters 511 and 512. The longitudinally coupled SAW filter 511 is formed by cascade-connecting SAW filter devices 501a and 501b in two stages via connecting patterns 520 and 521. The longitudinally coupled SAW filter 512 is formed by cascade-connecting a SAW filter device 501c and a SAW filter device 502, having transmission phase characteristics are 180° out of phase with each other, in two stages via a connecting pattern 521 and a connecting pattern 522.

In the above-described SAW filter unit, the input terminals of the SAW filter devices 501a and 501c are respectively connected to an unbalanced terminal 503 via wires 530 and 531. The SAW filter devices 501b and 502 are connected in series with each other via a wire 505, and are also respectively connected to output balanced terminals 504 via wires 532 and 533. Terminals 506 are ground terminals, which are respectively connected to the SAW filters devices 501a and 501c via wires 534 and 535.

An example of the multi-band filter is disclosed in Japanese Unexamined Patent Application Publication No. 10-341135 in which a plurality of SAW filter devices (SAW filters) are arranged on a piezoelectric substrate to obtain a plurality of pass bands.

In the above-described SAW filters having composite SAW filter devices, the plurality of SAW filter devices are provided on the same piezoelectric substrate. In order to reduce the size of such SAW filters, two or more SAW filter devices are disposed side by side in a SAW propagating direction.

However, such an arrangement of SAW filter devices causes ripples in the pass band of a transmission signal due to an influence of bulk waves.

In RF filters used in cellular telephones, the transmission characteristics in the pass band should be flat. The generation of ripples must be prevented to produce flat transmission characteristics.

One method of preventing the generation of ripples is to scatter bulk waves by roughening the reverse surface of a piezoelectric substrate (forming undulations by sandblasting). According to this method, however, the piezoelectric substrate is often broken or warped due to heat or stress applied to a wafer during processing.

In the above-described known SAW filters, the generation of ripples in the pass band is prevented by displacing a plurality of SAW filter devices such that they are not disposed in the corresponding SAW propagating directions. Such an arrangement of the SAW filter devices, however, increases the size of the substrate. Accordingly, there is a demand for a more compact SAW filter (SAW apparatus) in which ripples caused by bulk waves are reduced without performing sandblasting.

SUMMARY OF THE INVENTION

In order to overcome the above-described problems, preferred embodiments of the present invention provide a SAW apparatus including a first SAW filter device having a plurality of interdigital electrodes (interdigital transducers, which are hereinafter referred to as "IDTs") provided on a piezoelectric substrate along a direction in which a SAW propagates, and a second SAW filter device including a plurality of IDTs provided on the piezoelectric substrate along a direction in which a surface acoustic wave propagates. The propagation path of the first SAW filter device partially overlaps the propagation path of the second SAW filter device. When the center-to-center distance between the first SAW filter device and the second SAW filter device is indicated by $d_1$, and when the thickness of the piezoelectric substrate is indicated by t, the first SAW filter device, the second SAW filter device, and the piezoelectric substrate are arranged to satisfy the condition $d_1 \leq 2.3 \times t$ or $d_1 \geq 2.8 \times t$.

With this arrangement, the above-described SAW apparatus is provided with, not only a filtering function having a specific pass band, but also composite multiple functions by providing a plurality of SAW filter devices.

In the above-described configuration, since the first SAW filter device, the second SAW filter device, and the piezoelectric substrate are arranged to satisfy the condition $d_1 \leq 2.3 \times t$ or $d_1 \geq 2.8 \times t$, an influence of bulk waves caused by the excited SAW is effectively prevented between the first and second SAW filter devices.

Accordingly, ripples caused by bulk waves occurring in the transmission signal in the pass band are greatly reduced while achieving a reduced size and multiple functions of the SAW apparatus. Thus, flatter filtering characteristics are obtained such that the transmission characteristics in the pass band are greatly improved.

Additionally, according to the above-described configuration, an influence of bulk waves is prevented without performing sandblasting (to roughen the reverse surface of the piezoelectric substrate). Thus, breakage or warpage of the piezoelectric substrate caused by roughening the piezoelectric substrate is prevented, thereby decreasing the number of defective components produced in the manufacturing process.

In the aforementioned SAW apparatus, the transmission amplitude characteristics of the first SAW filter device in the pass band are preferably substantially the same as those of the second SAW filter device in the pass band. The transmission phase characteristics of the first SAW filter device are preferably substantially 180° out of phase with those of the second SAW filter device. An input terminal or an output terminal is an unbalanced terminal, and the other terminals are balanced terminals.

With the above arrangement, since the transmission phase characteristic of the first SAW filter device is about 180° out of phase with that of the second SAW filter device, a balun function is provided, thereby providing multiple functions for the SAW apparatus.

In the aforementioned SAW apparatus, the center frequency of the first SAW filter device is preferably different from that of the second SAW filter device such that the SAW apparatus functions as a multi-band filter. With this arrangement, the SAW apparatus is provided with composite multiple functions.

Another preferred embodiment of the present invention provides a SAW apparatus including first through fourth SAW filter devices, each having a plurality of IDTs provided on a piezoelectric substrate along a direction in which a SAW propagates. The first SAW filter device and the third SAW filter device are cascade-connected, and the second SAW filter device and the fourth SAW filter device are cascade-connected. The propagation path of the first SAW filter device partially overlaps with that of the second SAW filter device, and the propagation path of the third SAW filter device partially overlaps with that of the fourth SAW filter device. When the center-to-center distance between the first SAW filter device and the second SAW filter device is indicated by $d_1$, when the center-to-center distance between the third SAW filter device and the fourth SAW filter device is indicated by $d_2$, and when a wavelength of a SAW to be excited is indicated by $\lambda$, the first through fourth SAW filter devices are arranged such that the center-to-center distance $d_1$ is different from the center-to-center distance $d_2$ by an amount equal to approximately $(2n+1) \times 0.5\lambda$, ($n=0, 1, 2, 3$, and so on).

With the above-described configuration, by providing the first through fourth SAW filter devices, a filtering function having a specific pass band is provided, and composite multiple functions are obtained.

In the above-described configuration, the center-to-center distance $d_1$ is different from the center-to-center distance $d_2$ by an amount that is substantially equal to $(2n+1) \times 0.5\lambda$ ($n=0, 1, 2, 3$, and so on), i.e., a multiple of an odd number, of the SAW half-wavelength. Accordingly, even if the first and second SAW filter devices are located in close proximity to the third and fourth SAW filter devices to reduce the size of the SAW apparatus, ripples occurring between the first and second SAW filter devices and the third and fourth SAW filter devices caused by bulk waves are greatly reduced.

Thus, a filtering function is provided, and also, generation of ripples are reduced while achieving a smaller SAW apparatus provided with multiple functions. Accordingly, flatter filtering characteristics are obtained, thereby improving the transmission characteristics in the pass band.

In the aforementioned SAW apparatus, the transmission amplitude characteristics of the first through fourth SAW filter devices in the pass band are preferably substantially the same. Three of the first through fourth SAW filter devices preferably have substantially the same transmission phase characteristics, and the transmission phase characteristic of the remaining SAW filter device is preferably 180° out of phase with that of the other SAW filter devices. One of an input terminal and output terminals may be an unbalanced terminal, and the other terminals may be balanced terminals.

With this arrangement, by setting one of the SAW filter devices out of phase with the other three SAW filter devices, a balun function can be provided, thereby achieving multiple functions.

In the aforementioned SAW apparatus, when the thickness of the piezoelectric substrate is indicated by t, the first through fourth SAW filter devices and the piezoelectric substrate may be arranged so as to satisfy conditions $d_1 \leq 2.3 \times t$ or $d_1 \geq 2.8 \times t$ and $d_2 \leq 2.3 \times t$ or $d_2 \geq 2.8 \times t$.

With this arrangement, by setting the center-to-center distances $d_1$ and $d_2$ as described above, the generation of ripples is prevented, thereby improving the transmission characteristics.

In the aforementioned SAW apparatus, the piezoelectric substrate is preferably a 36° to 44° Y-cut X-propagating $LiTaO_3$ substrate. The insertion loss is reduced by high piezoelectric characteristics, and an influence of the environmental temperature is suppressed by excellent temperature characteristics.

A communications unit according to preferred embodiments of the present invention utilize one of the aforementioned SAW apparatuses according to other preferred embodiments of the present invention.

With this configuration, since a compact and multi-function SAW apparatus having outstanding transmission characteristics is utilized, the size of the communications unit is greatly decreased while exhibiting an outstanding transmission/reception function.

Other features, elements, characteristics and advantages of the present invention will become more apparent from the following detailed description of preferred embodiments thereof with reference to the attached drawings.

BRIEF DESCRIPTION OF THE DRAWINGS

FIGS. 5A, 5B and 5C illustrate the cancellation of ripples occurring in the SAW filter shown in FIG. 4.

DETAILED DESCRIPTION OF PREFERRED EMBODIMENTS

Preferred embodiments of the present invention are described in detail below with reference to FIGS. 1 through 8.

Figure 1:
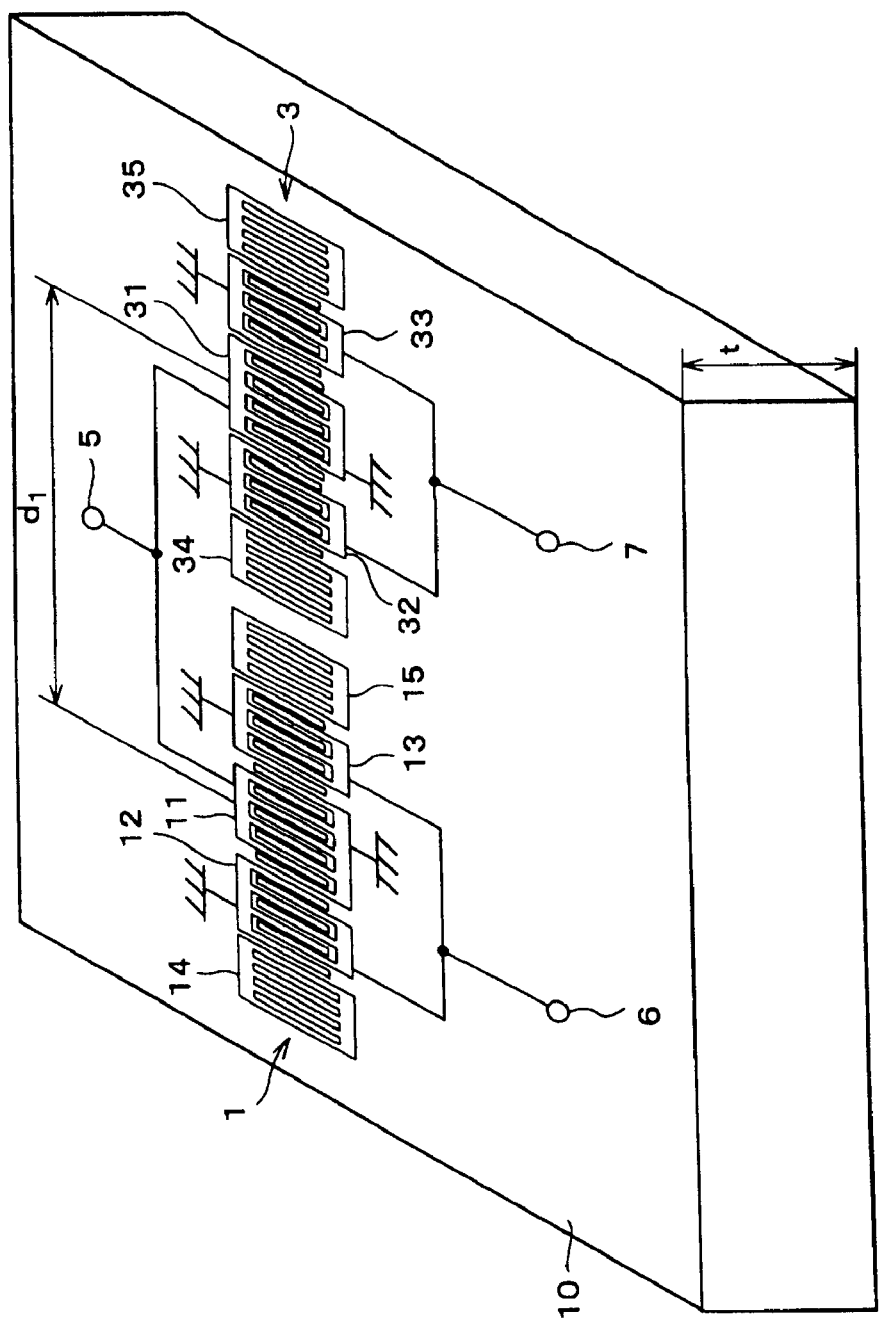
FIG. 1 is a perspective view schematically illustrating a SAW filter according to a first preferred embodiment of the present invention.

FIG. 1 is a perspective view schematically illustrating the structure of a SAW filter according to a first preferred embodiment of the present invention. In the SAW filter shown in FIG. 1, a first SAW filter device 1 and a second SAW filter device 3, having transmission phase characteristics that are about 180° out of phase with each other, are provided on a piezoelectric substrate 10.

The piezoelectric substrate 10 is made of, for example, 39° Y-cut X-propagating $LiTaO_3$, and the thickness t thereof is, for example, about 285 µm. The piezoelectric substrate 10 is not restricted to the above-described material, and may be made of another material which exhibits a different type of piezoelectric characteristic, for example, quartz or $LiNbO_3$.

The first and second SAW filter devices 1 and 3 have substantially the same configurations, e.g., their center frequencies are about 842.5 MHz. However, the transmission phase characteristic of the second SAW filter device 3 is about 180° out of phase with that of the first SAW filter device 1. With this arrangement, the SAW filter is provided with, not only a filtering function, but also a balun function.

In the first SAW filter device 1, IDTs 12 and 13 are respectively disposed at the left and right sides of a central IDT 11 in a SAW propagating direction. Reflectors 14 and 15 are arranged so as to sandwich the IDT 12, the central IDT 11, and the IDT 13 on the left and right sides. Also, in the second SAW filter device 3, an IDT 32, a central IDT 31, an IDT 33, and reflectors 34 and 35 are disposed in a similar manner to the first SAW filter device 1. Accordingly, the first and second SAW filter devices 1 and 3 are extensionally-coupled-resonator-mode devices.

The IDTs each include a strip-like base portion (bus bar) and two electrode portions provided with a plurality of strip-like electrode fingers. The electrode fingers extend substantially perpendicularly from one side of the base portion such that they are substantially parallel to each other. The electrode fingers are interdigitated with each other with substantially equal gaps therebetween such that the side edges thereof face each other.

In the above-configured IDTs, the signal conversion characteristics and the pass band are determined by setting the length and the width of each electrode finger, the gap between adjacent electrode fingers, and the length by which interdigitated electrode fingers face each other (hereinafter referred to as the "interdigital length").

The individual electrode fingers and the bus bars of the IDTs and the reflectors are made of, for example, aluminum (Al) electrodes (foil) on the piezoelectric substrate 10 by a suitable method, such as a photolithographic technique.

An unbalanced terminal 5 is connected to the central IDT 11 of the first SAW filter device 1 and the central IDT 31 of the second SAW filter device 3. One balanced terminal 6 is connected to the IDTs 12 and 13 of the first SAW filter device 1, while the other balanced terminal 7 is connected to the IDTs 32 and 33 of the second SAW filter device 3.

The first and second SAW filter devices 1 and 3 are disposed adjacent to each other in the SAW propagating direction, and the center-to-center distance $d_1$ is preferably about 620.0 µm. The center of the first SAW filter device 1 is defined by the center of the distance between the two ends of the IDTs 12, 11, and 13, excluding the reflectors 14 and 15, and more specifically, the center of the distance from the end of the electrode finger of the IDT 12 adjacent to the reflector 14 to the end of the electrode finger of the IDT 13 adjacent to the reflector 15. Similarly, the center of the second SAW filter device 3 is defined by the center of the distance between the two ends of the IDTs 32, 31, and 33, excluding the reflectors 34 and 35, and more specifically, the center of the distance from the end of the electrode finger of the IDT 32 adjacent to the reflector 34 to the end of the electrode finger of the IDT 33 adjacent to the reflector 35.

As described above, the first SAW filter device 1 and the second SAW filter device 3 are disposed adjacent to each other in the SAW propagating direction, and preferably, the center line of the propagating direction of the first SAW filter device 1 is substantially aligned with that of the second SAW filter device 3. With this arrangement, the size of the piezoelectric substrate 10 is greatly reduced, and the size of the resulting SAW filter is greatly reduced while achieving a SAW filter with multiple functions.

Only a few pairs of electrode fingers of each SAW filter device and a few electrode fingers of each reflector are shown in FIG. 1 to simplify the illustration thereof.

In the above-described SAW filter, an electrical signal is converted into a SAW by the IDTs 11 and 31 at the input side, and the SAW is reconverted into an electrical signal by the IDTs 12, 13, 32, and 33 at the output side, such that the desired frequency is selected. Thus, the SAW filter serves as a filter.

In the above-described SAW filter, a SAW excited by the IDTs propagates on the surface of the piezoelectric substrate 10, and bulk waves, which cause ripples, also propagate within the piezoelectric substrate 10.

Figure 2:
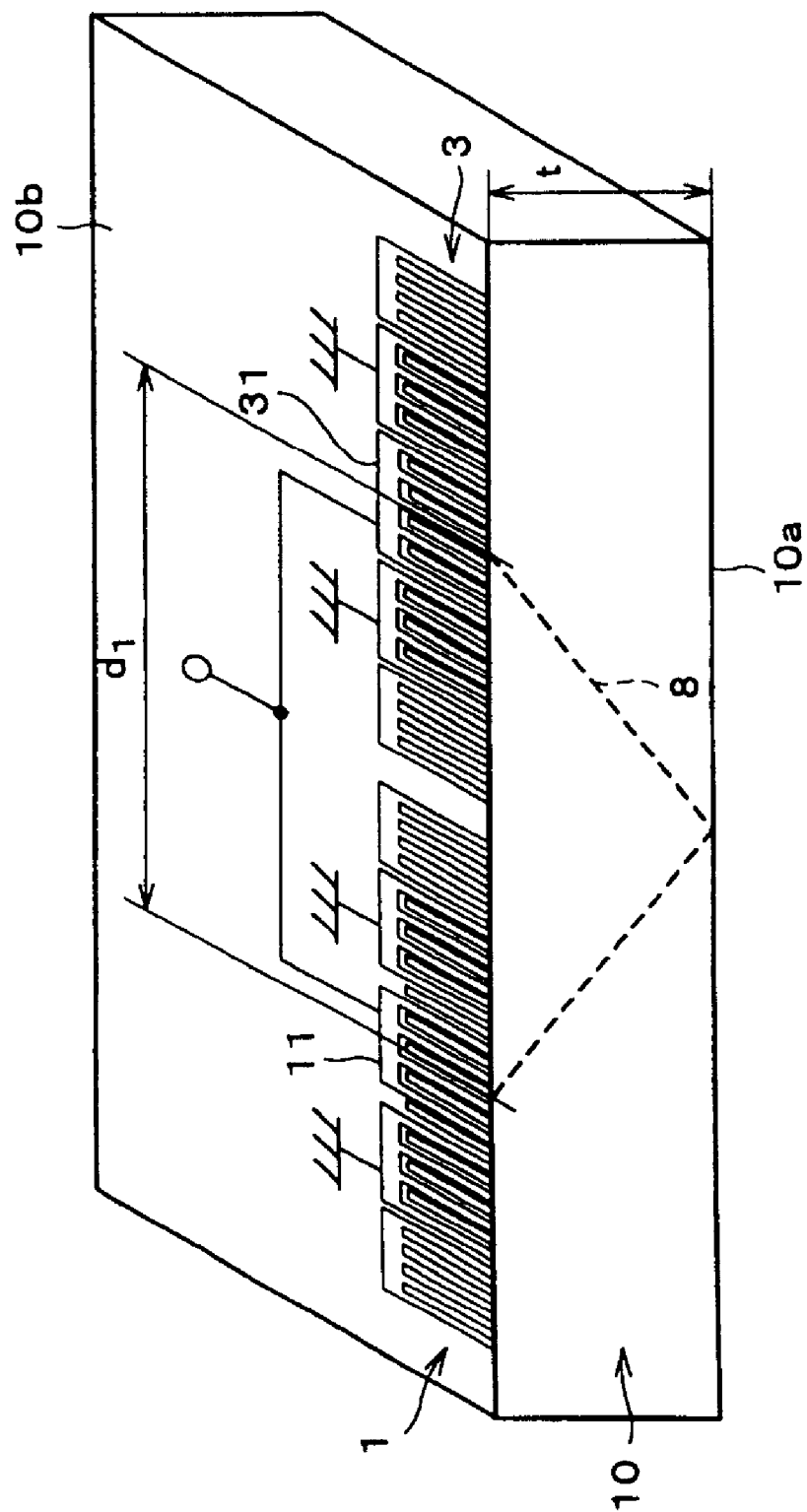
FIG. 2 illustrates the concept of the radiation of a bulk wave occurring in the SAW filter shown in FIG. 1.

The bulk waves are dependent upon direction, and the radiation angle is restricted to a certain range. As shown in FIG. 2, a bulk wave 8 radiates from the first SAW filter device 1 and is reflected at a bottom surface 10a of the piezoelectric substrate 10 and returns to an obverse surface 10b at a specific angle. In this case, if the bulk wave 8 returns to a portion close to the second SAW filter device 3, the bulk wave is strongly influenced by the second SAW filter device 3, thereby causing undesirable ripples in the transmission characteristics in the pass band.

By performing various studies to achieve filtering characteristics whose transmission characteristics in the pass band are flatter by avoiding an adverse influence of the bulk wave 8, we have discovered the following feature. The central IDT 31 of the second SAW filter device 3 adjacent to the first SAW filter device 1 is preferably disposed on a portion of the obverse surface 10b such that it does not interfere with the bulk wave 8 radiated from the first SAW filter device 1 and returned from the bottom surface 10a.

Then, we examined the relationship between the center-to-center distance $d_1$ between the first and second SAW filter devices 1 and 3 and the amount of rippling occurring in the pass band by varying the center-to-center distance $d_1$. The thickness t of the piezoelectric substrate 10 was also changed to examine the relationship between the center-to-center distance $d_1$ and the amount of rippling. The results are shown in FIG. 3.

Figure 3:
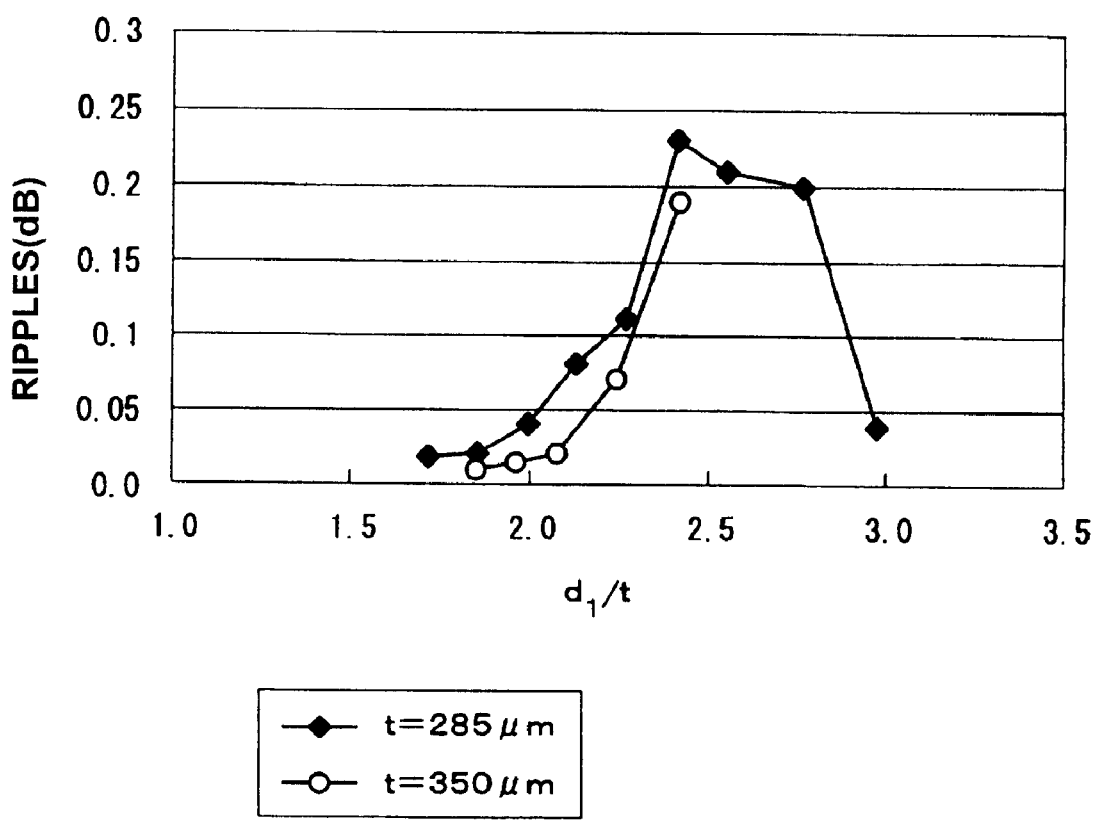
FIG. 3 illustrates the amount of rippling with respect to a change in the center-to-center distance $d_1$ in the SAW filter shown in FIG. 1.

FIG. 3 shows that the amount of rippling in the pass band is increased, i.e., about 0.15 dB or greater, when the center-to-center distance $d_1$ is in a range of $2.3t < d_1 < 2.8t$.

Accordingly, the first and second SAW filter devices 1 and 3 are disposed such that the center-to-center distance $d_1$ is outside the above-described range, thereby reducing the amount of rippling.

When the center-to-center distance $d_1$ is about 2.3t or less ($d_1 \leq 2.3 \times t$), or at least 2.8t ($d_1 \geq 2.8 \times t$), the advantages of preferred embodiments of the present invention are achieved. Preferably, however, the center-to-center distance $d_1$ is in a range of $1.6t \leq d_1 \leq 2.3t$ or $2.8t \leq d_1 \leq 3.5t$, and more preferably, in a range of $1.7t \leq d_1 \leq 2.1t$ or $2.9t \leq d_1 \leq 3.3t$. If $d_1$ exceeds approximately 3.5t, it is difficult to reduce the size of the SAW filter. If $d_1$ is less than approximately 1.6t, the number of electrode fingers of the reflectors is substantially reduced, thus increasing spurious responses outside the pass band.

Figure 4:
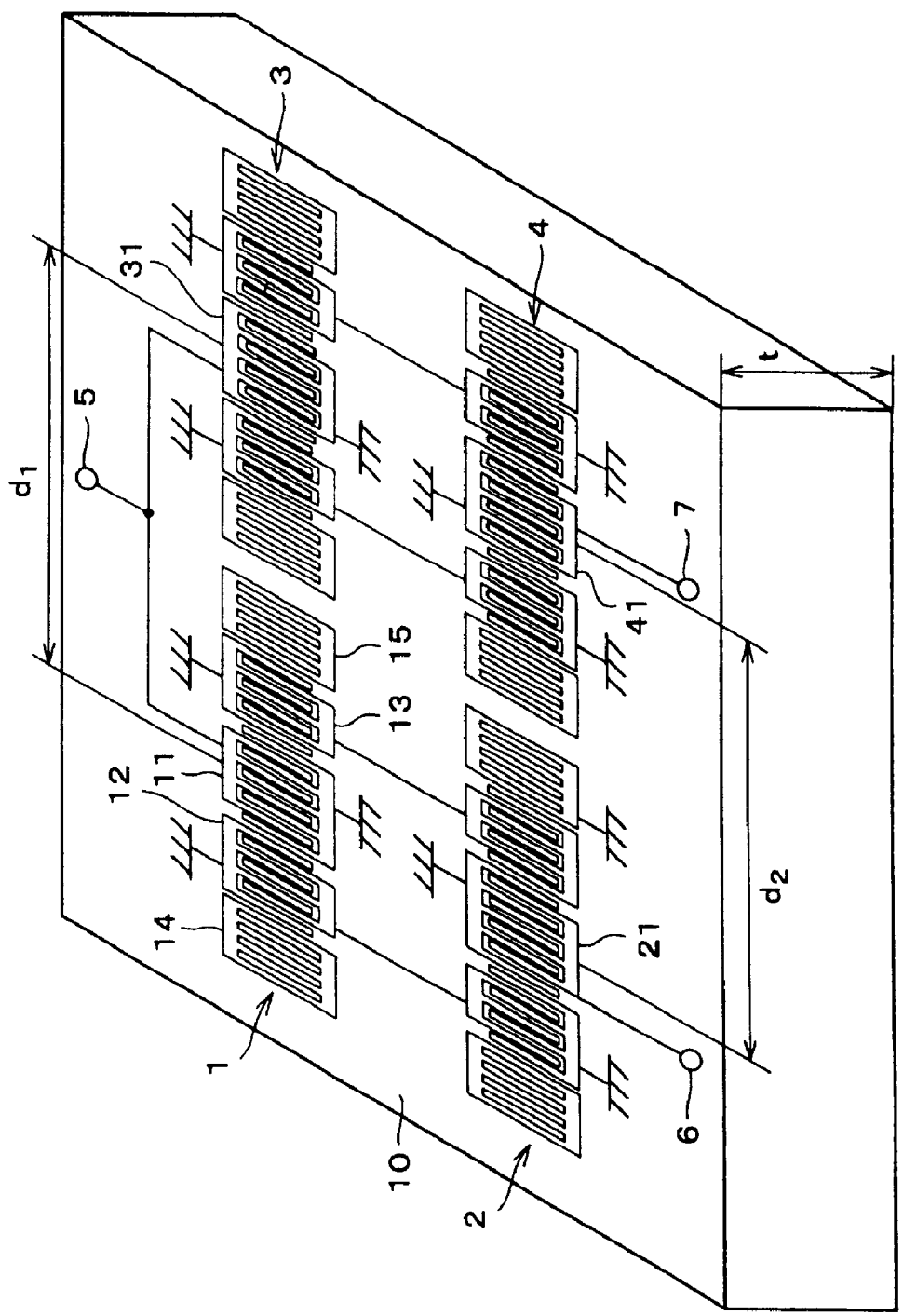
FIG. 4 is a perspective view schematically illustrating a SAW filter according to a second preferred embodiment of the present invention.

FIG. 4 is a perspective view schematically illustrating a SAW filter according to a second preferred embodiment of the present invention. In the second preferred embodiment of the present invention, the elements having functions similar to those of the SAW filter of the first preferred embodiment are indicated by like reference numerals, and an explanation thereof is thus omitted.

The SAW filter shown in FIG. 4 is a two-stage extensionally-coupled-resonator-mode SAW filter provided with, not only the first and second SAW filter devices 1 and 3, but also third and fourth SAW filter devices 2 and 4 (having a center frequency of about 942.5 MHz) on the piezoelectric substrate 10.

The transmission phase characteristics of the second SAW filter 3 are about 180° out of phase with those of the first, third, and fourth SAW filter devices 1, 2, and 4. With this arrangement, the above-described SAW filter is provided with, not only a filtering function, but also a balun function.

In the second preferred embodiment, the transmission phase characteristics of the second SAW filter device 3 are about 180° out of phase with the other SAW filter devices. However, any one of the SAW filter devices 1, 2, 4 can be arranged to be about 180° out of phase with the other SAW devices, in which case, advantages similar to those achieved by the second preferred embodiment are achieved.

The first and third SAW filter devices 1 and 2 are cascade-connected with each other, and the second and fourth SAW filter devices 3 and 4 are cascade-connected with each other. The SAW filter devices 1 through 4 are disposed such that the propagating direction of the SAW filter devices 1 and 3 is substantially parallel to that of the SAW filter devices 2 and 4. With this arrangement, the size of the resulting SAW filter is greatly reduced while achieving multiple functions.

The unbalanced terminal 5 of the SAW filter is connected to the central IDT 11 of the first SAW filter device 1 and the central IDT 31 of the second SAW filter device 3. One balanced terminal 6 is connected to a central IDT 21 of the third SAW filter device 2, while the other balanced terminal 7 is connected to a central IDT 41 of the fourth SAW filter device 4.

The first and second SAW filter devices 1 and 3 are disposed adjacent to each other in-the SAW propagating direction, and the center-to-center distance $d_1$ between the first and second SAW filter devices 1 and 3 is, for example, about 620.0 μm. The center of the first SAW filter device 1 is defined by the center of the distance between two ends of the IDTs 12, 11, and 13, excluding the reflectors 14 and 15, and more specifically, the center of the distance from the end of the electrode finger of the IDT 12 adjacent to the reflector 14 to the end of the electrode finger of the IDT 13 adjacent to the reflector 15. The center of the second SAW filter device 3 is determined in a manner similar to the first SAW filter device 1.

The third and fourth SAW filter devices 2 and 4 are disposed adjacent to each other in the SAW propagating direction, and the center-to-center distance $d_2$ between the third and fourth SAW filter devices 2 and 4 corresponding to the center-to-center distance $d_1$ is, for example, about 522.1 μm. Only a few pairs of SAW filter devices and a few reflectors are shown in FIG. 4 to simplify the illustration.

In the second preferred embodiment, a SAW filter including a balun function is provided by the two-stage cascade-connected SAW filter devices 1 through 4.

In this SAW filter, an electrical signal is converted into a SAW by the IDTs 11 and 31 at the input side, and the SAW is re-converted into an electrical signal by the IDTs 21 and 41 at the output side such that the desired frequency is selected. Thus, the SAW filter functions as a filter.

As discussed above, in the second preferred embodiment, the center-to-center distance $d_1$ between the first-stage SAW filter devices 1 and 3 is different from the center-to-center distance $d_2$ of the second-stage SAW filter devices 2 and 4. This is discussed in detail below.

The center-to-center distance $d_1$ of the first-stage SAW filter devices 1 and 3 is different from the center-to-center distance $d_2$ of the second-stage SAW filter devices 2 and 4 by an amount that is substantially equal to $(2n+1)/2$ times (n=0, 1, 2, 3, and so on) the SAW wavelength, thereby further reducing the amount of rippling in the pass band caused by bulk waves.

Ripples caused by bulk waves discussed in the first preferred embodiment depending upon the phase relationship between the SAW excited by the SAW filter devices and the bulk wave.

More specifically, when the SAW and the bulk wave are in phase, the two waves strengthen each other. Conversely, when the SAW is about 180° out of phase with the bulk wave, the two waves weaken each other. As shown in (a) of FIG. 5, undulations (ripples) occur, as indicated by the solid line, in the filtering characteristics (transmission characteristics) of the first-stage SAW filter devices 1 and 3. As shown in (b) of FIG. 5, undulations (ripples) occur, as indicated by the solid line, in the filtering characteristics of the second-stage SAW filter devices 2 and 4. The broken lines in (a) and (b) of FIG. 5 indicate the filtering characteristics unaffected by bulk waves.

Figure 5A:
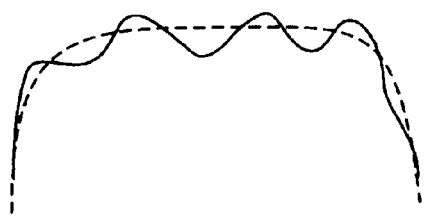
Figure 5A:
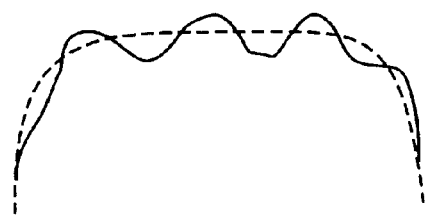
Figure 5A:
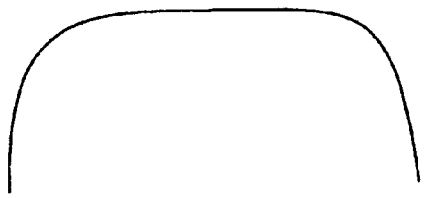

If the undulations of the transmission characteristics shown in (a) of FIG. 5 are inverted with those shown in (b) of FIG. 5, they cancel each other in the entire two-stage cascade-connected filter, resulting in filtering characteristics without ripples. The undulations are canceled by implementing an inverted phase relationship between the SAW and the bulk wave. This is achieved by displacing the center-to-center distance of the first-stage SAW filter devices from that of the second-stage SAW filter devices by $(2n+1)/2$ times (n=0, 1, 2, 3, and so on) the wavelength of a SAW to be excited.

The phase characteristics of the SAW are determined by the configuration of the electrode fingers of each SAW filter device 1, 2, 3 or 4 rather than the arrangement of the SAW filter devices 1 through 4. In contrast, concerning the bulk wave, the propagation path length is changed according to the arrangement of the SAW filter devices 1 through 4, and the phase characteristics of the bulk wave are changed accordingly.

A specific relationship exists between a SAW excited within a SAW filter device and a bulk wave that is radiated. Thus, if the center-to-center distance of the SAW filter devices is changed by an amount equal to about one wavelength, the propagation path length of the bulk wave is also changed by an amount that is substantially equal to one wavelength.

Accordingly, the center-to-center distance $d_1$ of the first-stage SAW filter devices 1 and 3 is different from the center-to-center distance $d_2$ of the second-stage SAW filter devices 2 and 4 by an amount that is substantially equal to (2n+1)/2 times (n=0, 1, 2, 3, and so on) the SAW wavelength. Then, the undulations generated by the bulk wave in the first-stage SAW filter devices 1 and 3 are inverted with respect to those in the second-stage SAW filter devices 2 and 4, and cancel each other in the overall two-stage cascade-connected filter. As a result, filtering characteristics without ripples are obtained, as shown in (c) of FIG. 5.

Figure 6:
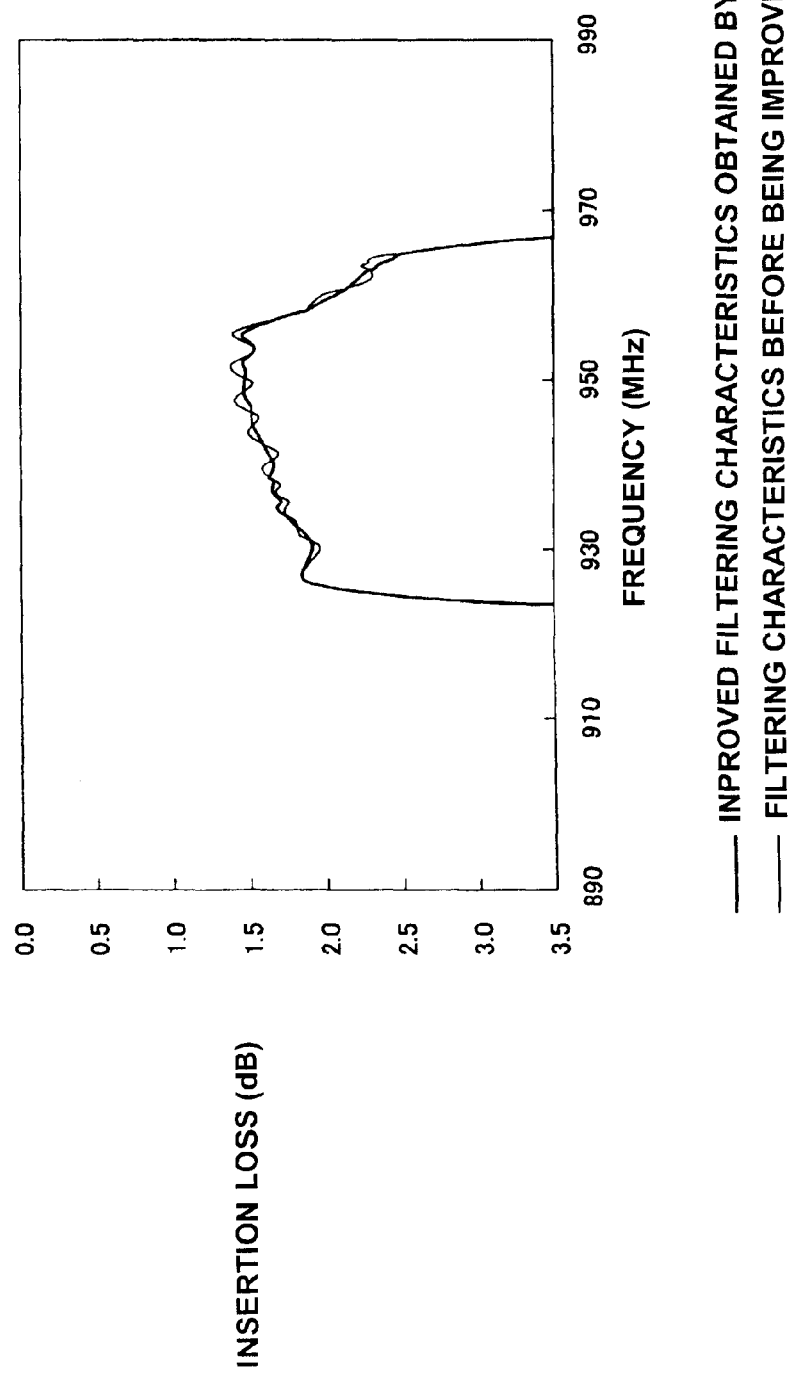
FIG. 6 illustrates improved filtering characteristics obtained in the SAW filter shown in FIG. 4 in comparison with filtering characteristics of a known SAW filter.

FIG. 6 illustrates the improved filtering characteristics obtained in the second preferred embodiment in comparison with the filtering characteristics of a known SAW filter. In the known SAW filter (comparative example), the center-to-center distances of the SAW filter devices and the thickness of the piezoelectric substrate are determined as follows: $d_1=d_2=620\,\mu m$ and $t=285\,\mu m$. FIG. 6 shows that the filtering characteristics obtained in the second preferred embodiment are outstanding without ripples as compared with the comparative example.

As in the first preferred embodiment, in the second preferred embodiment, the center-to-center distances $d_1$ and $d_2$ is set relative to the thickness t of the piezoelectric substrate 10, thereby achieving improved transmission characteristics.

Figure 7:
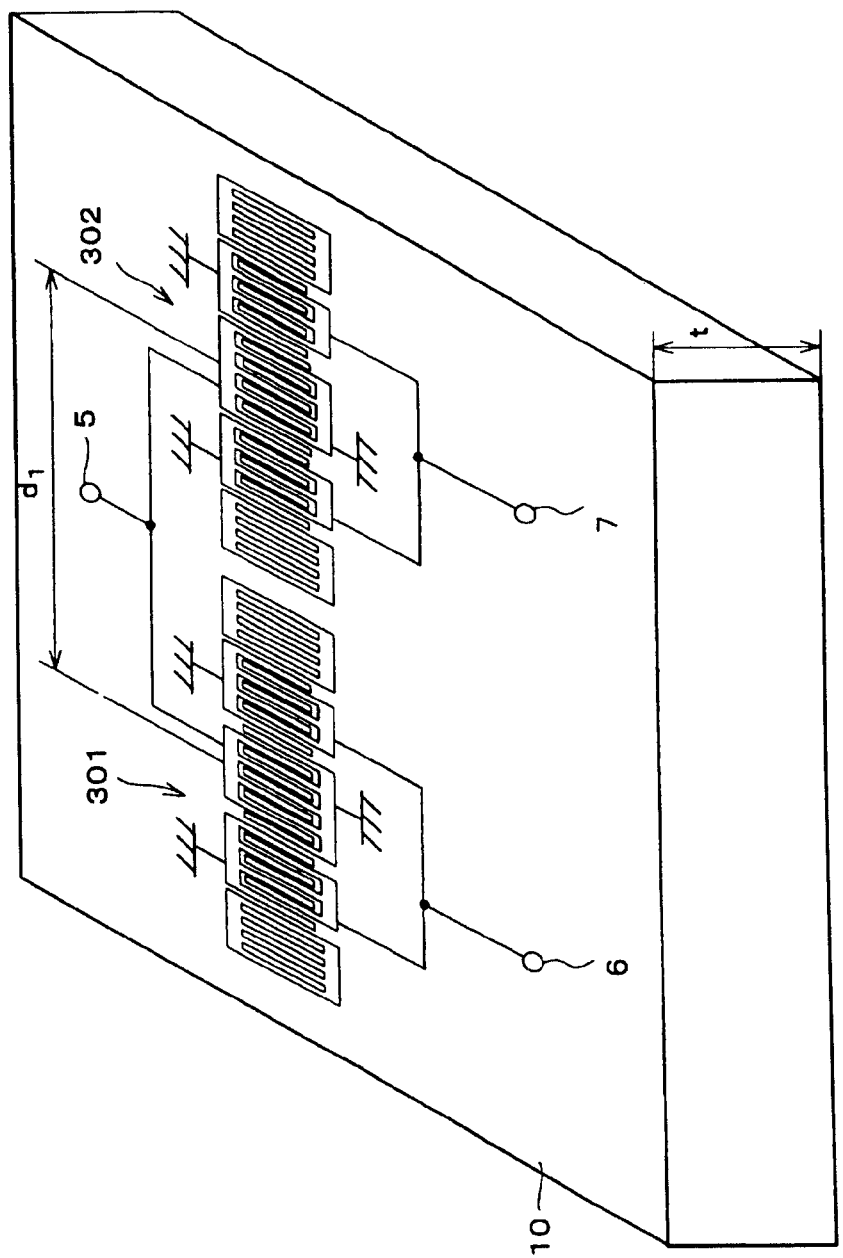
FIG. 7 is a perspective view schematically illustrating a SAW filter according to a third preferred embodiment of the present invention.

FIG. 7 is a perspective view schematically illustrating a multi-band SAW filter according to a third preferred embodiment of the present invention. The elements having functions similar to those of the SAW filters of the first and second preferred embodiments are indicated by like reference numerals, and an explanation thereof is thus omitted.

In the SAW filter shown in FIG. 7, a SAW filter device 301 having a center frequency of about 895.5 MHz and a SAW filter device 302 having a center frequency of about 942.5 MHz are provided on the piezoelectric substrate 10 so as to provide two pass bands.

The SAW filter devices 301 and 302 are configured similarly to the SAW filter device 1 of the first or second preferred embodiments, except that the center frequencies of the SAW filter devices 301 and 302 are different from each other.

Only a few pairs of electrode fingers of each SAW filter device 301 or 302 and a few electrode fingers of the reflectors are shown in FIG. 7 to simplify the illustration. The center-to-center distance $d_1$ between the SAW filter devices 301 and 302 in a SAW propagating direction is set to, for example, about 620 $\mu m$.

Unlike the first preferred embodiment, in the third preferred embodiment, the SAW filter devices 301 and 302 have different center frequencies and are disposed adjacent to each other. However, even though the center frequencies are different, the radiation angle of the bulk wave 8 is unchanged.

Accordingly, if the center-to-center distance $d_1$ between the SAW filter devices 301 and 302 is preferably within an approximate range of $2.3t<d_1<2.8t$, ripples occur in the transmission signal in the pass band for the same reason discussed in the first preferred embodiment.

Thus, the SAW filter devices 301 and 302 are arranged such that the center-to-center distance $d_1$ is outside the above-described range. Then, ripples occurring in the transmission signal in the pass band are greatly reduced. The features of the third preferred embodiment are applicable to the second preferred embodiment, in which case, advantages similar to those exhibited by the third preferred embodiment are obtained.

Figure 8:
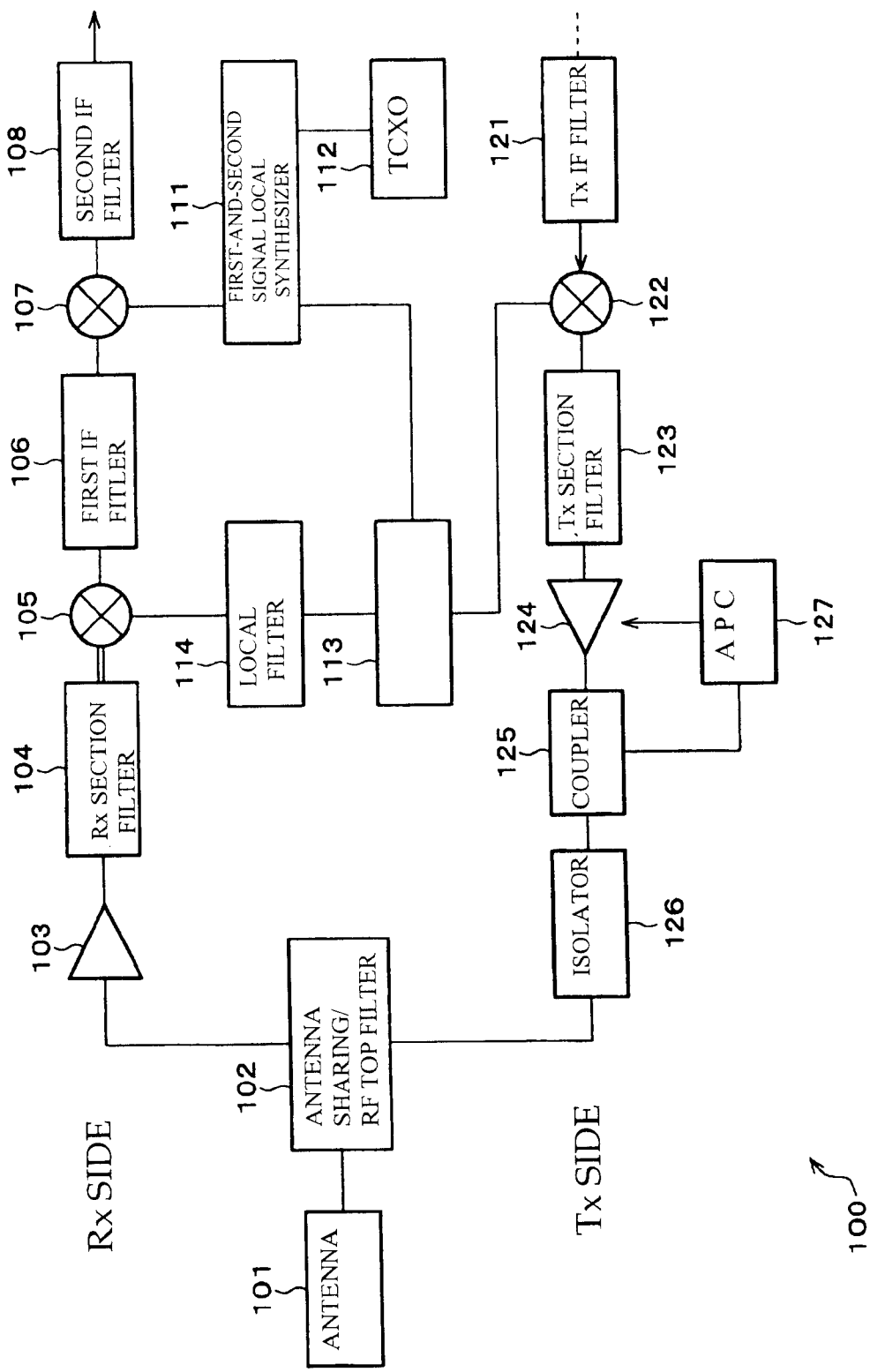
FIG. 8 is a block diagram illustrating the basic portions of a communications unit according to a fourth preferred embodiment of the present invention.
Figure 9:
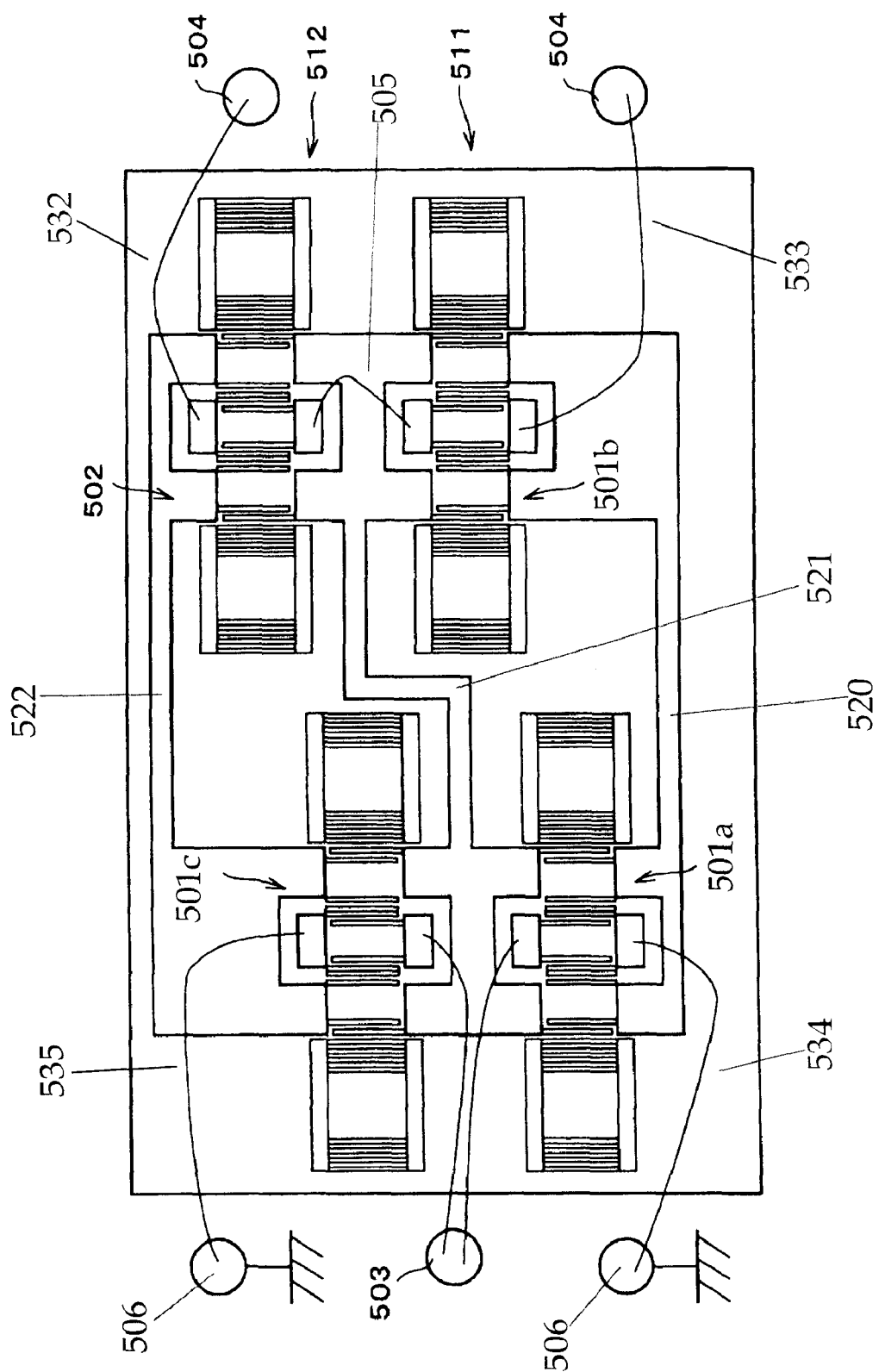
FIG. 9 is a plan view schematically illustrating a known SAW apparatus.

A description is now given, with reference to FIG. 8, of a communications unit 100 according to a fourth preferred embodiment of the present invention including one of the SAW filters of the first through third preferred embodiments mounted therein. In the communications unit 100, as shown in FIG. 8, a receiver (Rx) includes an antenna 101, an antenna sharing portion/RF top filter 102, an amplifier 103, an Rx section filter 104, a mixer 105, a first IF filter 106, a mixer 107, a second IF filter 108, a first-and-second-signal local synthesizer 111, a temperature-compensated crystal oscillator (TCXO) 112, a divider 113, and a local filter 114.

As indicated by two lines between the Rx section filter 104 and the mixer 105 shown in FIG. 8, two balanced signals are preferably transmitted from the Rx section filter 104 to the mixer 105 in order to maintain the balanced characteristics.

In the communications unit 100, a transmitter (Tx) includes the antenna 101, the antenna sharing portion/RF top filter 102, a Tx IF filter 121, a mixer 122, a Tx section filter 123, an amplifier 124, a coupler 125, an isolator 126, and an automatic power control (APC) device 127. The antenna 101 and the antenna sharing portion/RF top filter 102 are shared by the receiver (Rx) and the transmitter (Tx).

Any one of the SAW filters of the first through third preferred embodiments may be used as any one of the Rx section filter 104, the first IF filter 106, the Tx IF filter 121, and the Tx section filter 123.

Accordingly, in the above-described communications unit 100, since a compact and multi-functional SAW filter having outstanding transmission characteristics is used, the communications unit 100 is also provided with a outstanding transmission/reception function, in particular, in a GHz band or higher, and having a greatly reduced size.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave apparatus comprising:
   a piezoelectric substrate;
   a first surface acoustic wave filter device including a plurality of interdigital electrodes provided on the piezoelectric substrate along a direction in which a surface acoustic wave propagates; and
   a second surface acoustic wave filter device including a plurality of interdigital electrodes provided on the piezoelectric substrate along a direction in which a surface acoustic wave propagates, a propagation path of said first surface acoustic wave filter device being partially overlapped with a propagation path of said second surface acoustic wave filter device, wherein
   when the center-to-center distance between said first surface acoustic wave filter device and said second surface acoustic wave filter device is indicated by $d_1$, and when the thickness of said piezoelectric substrate indicated by t, said first surface acoustic wave filter device, said second surface acoustic wave filter device, and said piezoelectric substrate are arranged to satisfy a condition $d_1 \leq 2.3 \times t$ or $d_1 \geq 2.8 \times t$.

2. A surface acoustic wave apparatus according to claim 1, wherein transmission amplitude characteristics of said first surface acoustic wave filter device in a pass band are substantially the same as transmission amplitude characteristics of said second surface acoustic wave filter device in a pass band, and transmission phase characteristics of said first surface acoustic wave filter device are substantially 180° out of phase with transmission phase characteristics of said second surface acoustic wave filter device; and a plurality of terminals including an input terminal or output terminals are provided and one of the input terminal and the output terminals is an unbalanced terminal, and the other terminals are balanced terminals.

3. A surface acoustic wave apparatus according to claim 1, wherein a center frequency of said first surface acoustic wave filter device is different from a center frequency of said second surface acoustic wave filter device such that said surface acoustic wave apparatus is operable as a multi-band filter.

4. A surface acoustic wave apparatus according to claim 1, wherein said piezoelectric substrate is a 36° to 44° Y-cut X-propagating $LiTaO_3$ substrate.

5. A surface acoustic wave apparatus according to claim 1, wherein said first surface acoustic wave filter device includes reflectors arranged so as to sandwich the plurality of interdigital electrodes in the direction in which a surface acoustic wave propagates.

6. A surface acoustic wave apparatus according to claim 1, wherein said second surface acoustic wave filter device includes reflectors arranged so as to sandwich the plurality of interdigital electrodes in the direction in which a surface acoustic wave propagates.

7. A surface acoustic wave apparatus according to claim 1, wherein a condition $1.6t \leq d_1 \leq 2.3t$ or $2.8t \leq d_1 \leq 3.5t$ is satisfied.

8. A surface acoustic wave apparatus according to claim 1, wherein a condition $1.7t \leq d_1 \leq 2.1t$ or $2.9t \leq d_1 \leq 3.3t$ is satisfied.

9. A communication unit comprising the surface acoustic wave apparatus set forth in claim 1.

10. A surface acoustic wave apparatus comprising:

a piezoelectric substrate;

a first surface acoustic wave filter device including a plurality of interdigital electrodes provided on said piezoelectric substrate along a direction in which a surface acoustic wave propagates;

a second surface acoustic wave filter device including a plurality of interdigital electrodes provided on said piezoelectric substrate along a direction in which a surface acoustic wave propagates;

a third surface acoustic wave filter device including a plurality of interdigital electrodes provided on said piezoelectric substrate along a direction in which a surface acoustic wave propagates; and a fourth surface acoustic wave filter device including a plurality of interdigital electrodes provided on said piezoelectric substrate along a direction in which a surface acoustic wave propagates, said first surface acoustic wave filter device and said third surface acoustic wave filter device being cascade-connected, said second surface acoustic wave filter device and said fourth surface acoustic wave filter device being cascade-connected, a propagation path of said first surface acoustic wave filter device being partially overlapped with a propagation path of said second surface acoustic wave filter device, and a propagation path of said third surface acoustic wave filter device being partially overlapped with a propagation path of said fourth surface acoustic wave filter device; wherein when the center-to-center distance between said first surface acoustic wave filter device and said second surface acoustic wave filter device is indicated by $d_1$, when the center-to-center distance between said third surface acoustic wave filter device and said fourth surface acoustic wave filter device is indicated by $d_2$, and when a wavelength of a surface acoustic wave to be excited is indicated by $\lambda$, said first through fourth surface acoustic wave filter devices are arranged such that the center-to-center distance $d_1$ is differentiated from the center-to-center distance $d_2$ by an amount approximately equal to $(2n+1) \times 0.5\lambda$ ($n=0, 1, 2, 3$, and so on).

11. A surface acoustic wave apparatus according to claim 10, wherein transmission amplitude characteristics of said first through fourth surface acoustic wave filter devices in a pass band are substantially the same, and three of said first through fourth surface acoustic wave filter devices have substantially the same transmission phase characteristics, the transmission phase characteristics of the remaining surface acoustic wave filter device being substantially 180° out of phase with the transmission phase characteristics of the other surface acoustic wave filter devices, and a plurality of terminals including an input terminal or output terminals are provided and one of the input terminal and the output terminals is an unbalanced terminal, and the other terminals are balanced terminals.

12. A surface acoustic wave apparatus according to claim 10, wherein, when the thickness of said piezoelectric substrate is indicated by t, said first through fourth surface acoustic wave filter devices and said piezoelectric substrate are arranged to satisfy conditions $d_1 \leq 2.3 \times t$ or $d_1 \geq 2.8 \times t$ and $d_2 \leq 2.3 \times t$ or $d_2 \geq 2.8 \times t$.

13. A surface acoustic wave apparatus according to claim 12, wherein said piezoelectric substrate is a 36° to 44° Y-cut X-propagating $LiTaO_3$ substrate.

14. A surface acoustic wave apparatus according to claim 12, wherein a condition $1.6t \leq d_1 \leq 2.3t$ or $2.8t \leq d_1 \leq 3.5t$ is satisfied.

15. A surface acoustic wave apparatus according to claim 12, wherein a condition $1.7t \leq d_1 \leq 2.1t$ or $2.9t \leq d_1 \leq 3.3t$ is satisfied.

16. A surface acoustic wave apparatus according to claim 10, wherein said third surface acoustic wave filter device includes reflectors arranged so as to sandwich the plurality of interdigital electrodes in the direction in which a surface acoustic wave propagates.

17. A surface acoustic wave apparatus according to claim 10, wherein said fourth surface acoustic wave filter device includes reflectors arranged so as to sandwich the plurality of interdigital electrodes in the direction in which a surface acoustic wave propagates.

18. A surface acoustic wave apparatus according to claim 10, wherein said first surface acoustic wave filter device includes reflectors arranged so as to sandwich the plurality of interdigital electrodes in the direction in which a surface acoustic wave propagates.

19. A surface acoustic wave apparatus according to claim 10, wherein said second surface acoustic wave filter device includes reflectors arranged so as to sandwich the plurality of interdigital electrodes in the direction in which a surface acoustic wave propagates.

20. A communication unit comprising the surface acoustic wave apparatus set forth in claim 10.

* * * * *